US008154883B2

(12) United States Patent
Welker et al.

(10) Patent No.: US 8,154,883 B2
(45) Date of Patent: Apr. 10, 2012

(54) NAVIGATION TOOL SOCKET FOR A HANDHELD WIRELESS COMMUNICATION DEVICE

(75) Inventors: Michael Welker, Waterloo (CA); Timothy Kyowski, Kitchener (CA); Dennis Penner, Wellesley (CA)

(73) Assignee: Research In Motion Limited, Waterloo (CA)

( * ) Notice: Subject to any disclaimer, the term of this patent is extended or adjusted under 35 U.S.C. 154(b) by 562 days.

(21) Appl. No.: 12/036,074

(22) Filed: Feb. 22, 2008

(65) Prior Publication Data

US 2009/0213556 A1 Aug. 27, 2009

(51) Int. Cl.
*H04B 1/03* (2006.01)
*H05K 5/02* (2006.01)
(52) U.S. Cl. ......... 361/814; 439/842; 439/821; 455/566
(58) Field of Classification Search .................. 361/814; 455/566; 439/71, 862, 842
See application file for complete search history.

(56) References Cited

U.S. PATENT DOCUMENTS

| 4,887,969 A | 12/1989 | Abe |
| 5,762,505 A | 6/1998 | Lin |
| 6,974,345 B2 * | 12/2005 | Yang et al. ................... 439/331 |
| 7,147,481 B2 * | 12/2006 | Yang ............................... 439/71 |
| 2004/0253989 A1 * | 12/2004 | Tupler et al. .................. 455/566 |
| 2005/0239302 A1 | 10/2005 | Wada |
| 2006/0105631 A1 * | 5/2006 | Yang .............................. 439/607 |
| 2007/0192028 A1 | 8/2007 | Lee et al. |
| 2010/0265389 A1 * | 10/2010 | Mizumura .................... 348/374 |
| 2010/0283890 A1 * | 11/2010 | Mizumura .................... 348/374 |
| 2010/0321899 A1 * | 12/2010 | Vossoughi et al. ............ 361/728 |

FOREIGN PATENT DOCUMENTS

| JP | 07-036618 | 7/1995 |
| JP | 08-286799 | 1/1996 |
| JP | 2006-140111 | 1/2006 |

OTHER PUBLICATIONS

European Search Report for European Patent Application EP08151828.4, dated Jul. 14, 2008.
Communication under Rule 71(3) EPC; EP App. No. 08151828.4, dated Apr. 7, 2010.
Office Action dated Jun. 15, 2011 in corresponding Japanese Patent Application No. 2009-032031.

\* cited by examiner

*Primary Examiner* — Yuriy Semenenko
*Assistant Examiner* — Andargie M Aychillhum
(74) *Attorney, Agent, or Firm* — Novak Druce + Quigg LLP (57) ABSTRACT

A socket is configured to receive a trackball device in a receiving space formed therein. The socket has an exterior configured to fit within an installation recess in a printed circuit board. A biased electrical interconnector extends from an interior surface of the receiving space into the receiving space, the electrical interconnector oriented within the receiving space at a position that establishes biased electrical contact with a target electrical contact of the trackball device and biased electrical contact with a corresponding electrical contact on the printed circuit board when the socket is installed in an installation recess.

21 Claims, 8 Drawing Sheets

| 1 | 2 | 3 | 4 | 5 | 6 | 7 | 8 | 9 | 0 |
|---|---|---|---|---|---|---|---|---|---|
| Q | W | E | R | T | Y | U | I | O | P |
| A | S | D | F | G | H | J | K | L | |
| Z | X | C | V | B | N | M | | | |

*FIG. 11a*

| 1 | 2 | 3 | 4 | 5 | 6 | 7 | 8 | 9 | 0 |
|---|---|---|---|---|---|---|---|---|---|
| Q | W | E | R | T | Z | U | I | O | P |
| A | S | D | F | G | H | J | K | L | |
| Y | X | C | V | B | N | M | | | |

*FIG. 11b*

| 1 | 2 | 3 | 4 | 5 | 6 | 7 | 8 | 9 | 0 |
|---|---|---|---|---|---|---|---|---|---|
| A | Z | E | R | T | Y | U | I | O | P |
| Q | S | D | F | G | H | J | K | L | |
| W | X | C | V | B | N | M | | | |

*FIG. 11c*

| 1 | 2 | 3 | 4 | 5 | 6 | 7 | 8 | 9 | 0 |
|---|---|---|---|---|---|---|---|---|---|
| | | | P | Y | F | G | C | R | L |
| A | O | E | U | I | D | H | T | N | S |
| | Q | J | K | X | B | M | W | V | Z |

NAVIGATION TOOL SOCKET FOR A HANDHELD WIRELESS COMMUNICATION DEVICE

FIELD

The present disclosure, in a broad sense, is directed toward handheld electronic devices. More specifically, the disclosure is directed toward handheld communication devices that have wireless communication capabilities and the networks within which the wireless communication devices operate. The present disclosure further relates to a socket for mounting a trackball assembly on the handheld communication device.

BACKGROUND

With the advent of more robust wireless communications systems, compatible handheld communication devices are becoming more prevalent, as well as advanced. Where in the past such handheld communication devices typically accommodated either voice transmission (cell phones) or text transmission (pagers and PDAs), today's consumer often demands a combination device capable of performing both types of transmissions, including even sending and receiving e-mail. Furthermore, these higher-performance devices can also be capable of sending and receiving other types of data including that which allows the viewing and use of Internet websites. These higher level functionalities necessarily require greater user interaction with the devices through included user interfaces (UIs) which may have originally been designed to accommodate making and receiving telephone calls and sending messages over a related Short Messaging Service (SMS). As might be expected, suppliers of such mobile communication devices and the related service providers are anxious to meet these customer requirements, but the demands of these more advanced functionalities have in many circumstances rendered the traditional user interfaces unsatisfactory, a situation that has caused designers to have to improve the UIs through which users input information and control these sophisticated operations.

Keyboards are used on many handheld devices, including telephones and mobile communication devices. The size of keyboards has been reduced over the years, as newer, smaller devices have become popular. Cell phones, for example, are now sized to fit in one's pocket or the palm of the hand. As the size of the devices has decreased, the more important it has become to utilize all of the keyboard surface as efficiently as possible.

Many keyboards on mobile devices have an input device for navigation through the graphical user interface. These interfaces include such devices as trackballs and rotating wheels which can be used to affect movement of a cursor or pointer, or to scroll up, down and about a displayed page. These navigation devices often occupy a relatively large amount of space on the incorporating mobile device. Because the navigation device is frequently used and often requires fine control, a lower end size limitation will normally be observed by device designers. To accommodate such larger, more convenient navigation devices on the housing of the mobile device, the amount of space that is available for the keys of the keyboard is correspondingly reduced if the keyboard and navigational device are proximately located to one another.

Traditionally, an input device such as a trackball is mounted on the surface of a printed circuit board. In order to accommodate a device with a thinner profile, an alternate mounting mechanism for the navigation tool is desirable.

BRIEF DESCRIPTION OF THE DRAWINGS

Exemplary methods and arrangements conducted and configured according to the advantageous solutions presented herein are depicted in the accompanying drawings wherein.

DETAILED DESCRIPTION

Figure 1:
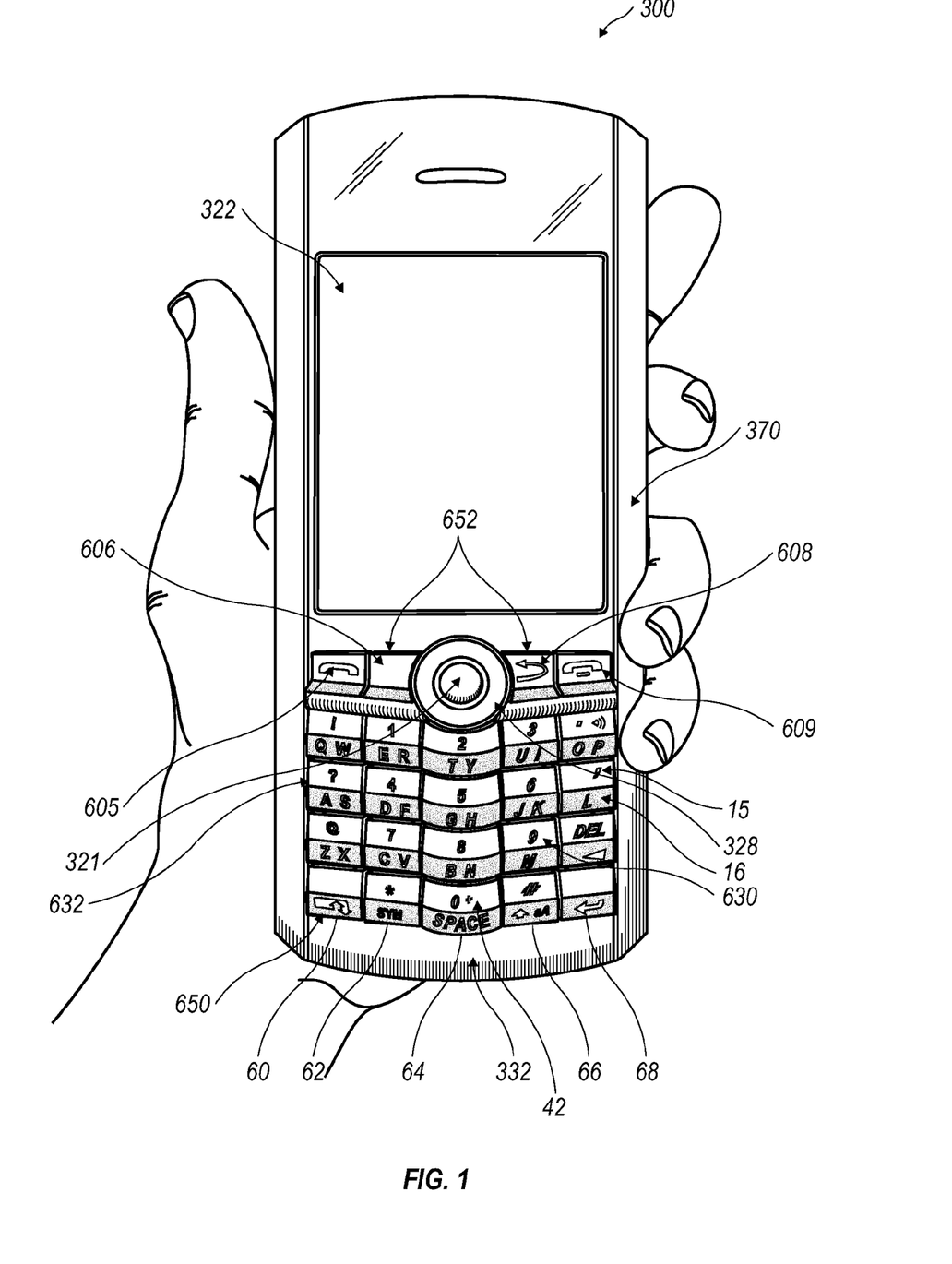
FIG. 1 depicts a handheld communication device configured according to the present teachings cradled in the palm of a user's hand.
Figure 2:
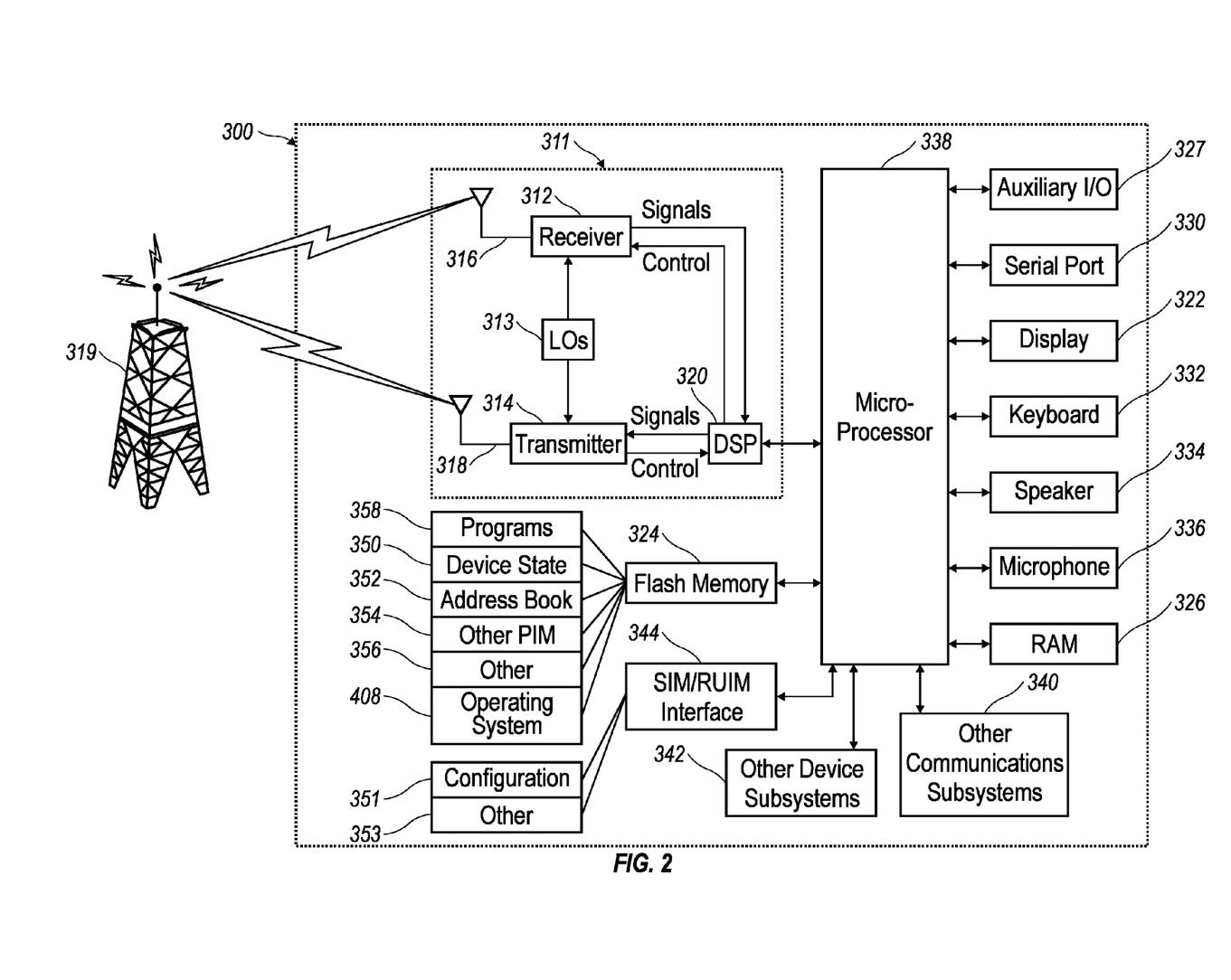
FIG. 2 is a block diagram representing a wireless handheld communication device interacting in a communication network.

An exemplary handheld electronic device 300 such as is shown in FIG. 1 and the device's cooperation in a wireless network 319 is exemplified in the block diagram of FIG. 2. These figures are exemplary only, and those persons skilled in the art will appreciate the additional elements and modifications necessary to make the device 300 work in particular network environments. While the following exemplary embodiments are described in connection with handheld electronic devices, it can be appreciated by those skilled in the art that these embodiments can also be implemented in other mobile devices such as PDAs, or the like.

The block diagram of FIG. 2 denotes the device's 300 inclusion of a microprocessor 338 that controls the operation of the device 300. A communication subsystem 311 performs all communication transmission and reception with the wireless network 319. The microprocessor 338 further connects with an auxiliary input/output (I/O) subsystem 327, a serial port (preferably a Universal Serial Bus port) 330, a display 322, a keyboard 332, a speaker 334, a microphone 336, random access memory (RAM) 326, and flash memory 324. Other communication subsystems 340 and other device subsystems 342 are generally indicated as being functionally connected with the microprocessor 338 as well. An example of a communication subsystem 340 is that of a short range communication system such as BLUETOOTH® communication module or an infrared device and associated circuits and components. Additionally, the microprocessor 338 is able to perform operating system 408 functions and preferably enables execution of software applications on the communication device 300.

The included auxiliary I/O subsystem 327 can take the form of a variety of different navigation tools including a trackball 321 based device, a thumbwheel, a navigation pad, or a joystick, just as examples. These navigation tools are preferably located on the front surface of the device 300 but may be located on any exterior surface of the device 300. Other auxiliary I/O devices can include external display devices and externally connected keyboards (not shown). While the above examples have been provided in relation to the auxiliary I/O subsystem 327, other subsystems capable of providing input or receiving output from the handheld electronic device 300 are considered within the scope of this disclosure. Additionally, other keys may be placed along the side of the device 300 to function as escape keys, volume control keys, scrolling keys, power switches, or user programmable keys, and may likewise be programmed accordingly.

As may be appreciated from FIG. 1, the handheld communication device 300 comprises a lighted display 322 located above a keyboard 332 suitable for accommodating textual input to the handheld communication device 300 when in an operable configuration. The front face of the device has a keyfield 650 that includes menu keys 652, alphanumeric keys 630, alphabetic keys 632, numeric keys 42, and other function keys as shown in FIG. 1. As shown, the device 300 is of unibody construction, also known as a "candy-bar" design.

Keys, typically of a push-button or push-pad nature, perform well as data entry devices but present problems to the user when they must also be used to affect navigational control over a screen-cursor. In order to solve this problem the present handheld electronic device 300 preferably includes an auxiliary input 327 that acts as a cursor navigational tool and which is also exteriorly located upon the front face of the device 300. Its front face location is particularly advantageous because it makes the tool easily thumb-actuable like the keys of the keyboard. A particularly usable embodiment provides the navigational tool in the form of a trackball 321 which is easily utilized to instruct two-dimensional screen cursor movement in substantially any direction, as well as act as an actuator when the ball 321 is depressed like a button. The placement of the trackball 321 is preferably above the keyboard 332 and below the display screen 322; here, it avoids interference during keyboarding and does not block the user's view of the display screen 322 during use.

Referring again to FIG. 1, the handheld wireless communication device 300 is also configured to send and receive voice communications such as mobile telephone calls. At least one key of the key field 650 is positioned adjacent to the trackball navigation tool and that key has a circular arc-shaped edge conformance fitting to a circular arc-shaped boundary about the trackball navigation tool 328. To facilitate telephone calls, two call keys 605, 609 oppositely and laterally flank the trackball navigation tool. One of the two call keys is a call initiation key 605 and the other is a call termination key 609.

The key 606 positioned adjacent to the trackball navigation tool 328 is a menu key that upon actuation displays an available action menu on the display in dependence of the currently running application on the device 300.

Furthermore, the device is equipped with components to enable operation of various programs, as shown in FIG. 2. In an exemplary embodiment, the flash memory 324 is enabled to provide a storage location for the operating system 408, device programs 358, and data. The operating system 408 is generally configured to manage other application programs 358 that are also stored in memory 324 and executable on the processor 338. The operating system 408 honors requests for services made by application programs 358 through predefined application program 358 interfaces. More specifically, the operating system 408 typically determines the order in which multiple applications 358 executed on the processor 338 and the execution time allotted for each application 358, manages the sharing of memory 324 among multiple applications 358, handles input and output to and from other device subsystems 342, and so on. In addition, users can typically interact directly with the operating system 408 through a user interface usually including the keyboard 332 and display screen 322. While the operating system 408 in a preferred embodiment is stored in flash memory 324, the operating system 408 in other embodiments is stored in read-only memory (ROM) or similar storage element (not shown). As those skilled in the art will appreciate, the operating system 408, device application 358 or parts thereof may be loaded in RAM 326 or other volatile memory.

In a preferred embodiment, the flash memory 324 contains programs/applications 358 for execution on the device 300 including an address book 352, a personal information manager (PIM) 354, and the device state 350. Furthermore, programs 358 and other information 356 including data can be segregated upon storage in the flash memory 324 of the device 300.

When the device 300 is enabled for two-way communication within the wireless communication network 319, it can send and receive signals from a mobile communication service. Examples of communication systems enabled for two-way communication include, but are not limited to, the GPRS (General Packet Radio Service) network, the UMTS (Universal Mobile Telecommunication Service) network, the EDGE (Enhanced Data for Global Evolution) network, and the CDMA (Code Division Multiple Access) network and those networks, generally described as packet-switched, narrowband, data-only technologies which are mainly used for short burst wireless data transfer. For the systems listed above, the communication device 300 must be properly enabled to transmit and receive signals from the communication network 319. Other systems may not require such identifying information. GPRS, UMTS, and EDGE require the use of a SIM (Subscriber Identity Module) in order to allow communication with the communication network 319. Likewise, most CDMA systems require the use of a RUIM (Removable Identity Module) in order to communicate with the CDMA network. The RUIM and SIM card can be used in multiple different communication devices 300. The communication device 300 may be able to operate some features without a SIM/RUIM card, but it will not be able to communicate with the network 319. A SIM/RUIM interface 344 located within the device 300 allows for removal or insertion of a SIM/

RUIM card (not shown). The SIM/RUIM card features memory and holds key configurations 351, and other information 353 such as identification and subscriber related information. With a properly enabled communication device 300, two-way communication between the communication device 300 and communication network 319 is possible.

If the communication device 300 is enabled as described above or the communication network 319 does not require such enablement, the two-way communication enabled device 300 is able to both transmit and receive information from the communication network 319. The transfer of communication can be from the device 300 or to the device 300. In order to communicate with the communication network 319, the device 300 in a preferred embodiment is equipped with an integral or internal antenna 318 for transmitting signals to the communication network 319. Likewise the communication device 300 in the preferred embodiment is equipped with another antenna 316 for receiving communication from the communication network 319. These antennae (316, 318) in another preferred embodiment are combined into a single antenna (not shown). As one skilled in the art would appreciate, the antenna or antennae (316, 318) in another embodiment are externally mounted on the device 300.

When equipped for two-way communication, the communication device 300 features a communication subsystem 311. As is well known in the art, this communication subsystem 311 is modified so that it can support the operational needs of the device 300. The subsystem 311 includes a transmitter 314 and receiver 312 including the associated antenna or antennae (316, 318) as described above, local oscillators (LOs) 313, and a processing module 320 which in a preferred embodiment is a digital signal processor (DSP) 320.

It is contemplated that communication by the device 300 with the wireless network 319 can be any type of communication that both the wireless network 319 and device 300 are enabled to transmit, receive and process. In general, these can be classified as voice and data. Voice communication is communication in which signals for audible sounds are transmitted by the device 300 through the communication network 319. Data is all other types of communication that the device 300 is capable of performing within the constraints of the wireless network 319.

As intimated hereinabove, one of the more important aspects of the handheld electronic device 300 to which this disclosure is directed is its size. While some users will grasp the device 300 in both hands, it is intended that a predominance of users will cradle the device 300 in one hand in such a manner that input and control over the device 300 can be affected using the thumb of the same hand in which the device 300 is held, however it is appreciated that additional control can be effected by using both hands. As a handheld device 300 that is easy to grasp and desirably pocketable, the size of the device 300 must be kept relatively small. Of the device's dimensions, limiting its width is important for the purpose of assuring cradleability in a user's hand. Moreover, it is preferred that the width of the device 300 be maintained at less than ten centimeters (approximately four inches). Keeping the device 300 within these dimensional limits provides a hand cradleable unit that users prefer for its usability and portability. Limitations with respect to the height (length) of the device 300 are less stringent when considering hand-cradleability. Therefore, in order to gain greater size, the device 300 can be advantageously configured so that its height is greater than its width, but still remain easily supported and operated in one hand.

A potential problem is presented by the small size of the device 300 in that there is limited exterior surface area for the inclusion of user input and device output features. This is especially true for the "prime real estate" on the front face of the device 300, where it is most advantageous to include a display screen 322 that outputs information to the user. The display screen 322 is preferably located above a keyboard that is utilized for data entry into the device 300 by the user. If the screen 322 is provided below the keyboard 332, a problem occurs in that viewing the screen 322 is inhibited when the user is inputting data using the keyboard 332. Therefore it is preferred that the display screen 322 be above the input area, thereby solving the problem by assuring that the hands and fingers do not block the view of the screen 332 during data entry periods.

To facilitate textual data entry into the device 300, an alphabetic keyboard is provided. In one version, a full alphabetic keyboard 332 is utilized in which there is one key per letter. In this regard, the associated letters can be advantageously organized in QWERTY, QWERTZ, AZERTY or Dvorak layouts, among others, thereby capitalizing on certain users' familiarity with these special letter orders. In order to stay within the bounds of the limited front surface area, however, each of the keys must be commensurately small when, for example, twenty-six keys must be provided in the instance of the English language.

An alternative configuration is to provide a reduced keyboard in which at least some of the keys have more than one letter associated therewith (see FIG. 1 for an example). This means that fewer keys are required which makes it possible for those fewer keys to each be larger than in the instance when a full keyboard is provided on a similarly dimensioned device. Some users will prefer the solution of the larger keys over the smaller ones, but it is necessary that software or hardware solutions be provided in order to discriminate which of the several associated letters the user intends based on a particular key actuation, a problem the full keyboard avoids.

Preferably, the character discrimination is accomplished utilizing disambiguation software included on the device 300. To accommodate software use on the device 300, a memory 324 and microprocessor 338 are provided within the body of the handheld unit for receiving, storing, processing, and outputting data during use. Therefore, the problem of needing a textual data input means is solved by the provision of either a full or reduced alphabetic keyboard 332 on the presently disclosed handheld electronic device 300. It should be further appreciated that the keyboard 332 can be alternatively provided on a touch sensitive screen in either a reduced or full format.

Keys, typically of a push-button or touchpad nature, perform well as data entry devices but present problems to the user when they must also be used to affect navigational control over a screen-cursor. In order to solve this problem, the present handheld electronic device 300 preferably includes an auxiliary input that acts as a cursor navigational tool and which is also exteriorly located upon the front face of the device 300. Its front face location is particularly advantageous because it makes the tool easily thumb-actuable like the keys of the keyboard. In a particularly useful embodiment, the navigational tool is a trackball 321 which is easily utilized to instruct two-dimensional screen cursor movement in substantially any direction, as well as act as an actuator when the ball of the trackball 321 is depressed like a button. The placement of the trackball 321 is preferably above the keyboard 332 and below the display screen 322; here, it avoids interference during keyboarding and does not block the user's view of the display screen 322 during use (See FIG. 1).

In some configurations, the handheld electronic device 300 may be standalone in that it does not connect to the "outside world." As discussed before, one example would be a PDA that stores such things as calendars and contact information but is not capable of synchronizing or communicating with other devices. In most situations such isolation will be viewed detrimentally in that synchronization is a highly desired characteristic of handheld devices today. Moreover, the utility of the device 300 is significantly enhanced when connectable within a communication system, and particularly when connectable on a wireless basis in a network 319 in which voice, text messaging, and other data transfer are accommodated.

As shown in FIG. 1, the handheld electronic device 300 is cradleable in the palm of a user's hand. The handheld device 300 is provided with a keyboard 332 to enter text data and place telephone calls and a display screen 322 for communicating information to the user. A connect/send key 605 is preferably provided to aid in the placement of a phone call. Additionally, a disconnect/end key 609 is provided. The send key 605 and end key 609 preferably are arranged in a row of keys including a auxiliary input device 327. Additionally, the row of keys, including the navigation tool, preferably has a menu key 606 and a back key or escape key 608. The menu key 606 is used to bring up a menu and the escape key 608 is used to return to the previous screen or previous menu selection.

The handheld electronic device 300 includes an input portion 604 and an output display portion. The output display portion can be a display screen 322, such as an LCD or other similar display device.

The keyboard 332 includes a plurality of keys that can be of a physical nature such as actuable buttons or they can be of a software nature, typically constituted by virtual representations of physical keys on a display screen 322 (referred to herein as "software keys"). It is also contemplated that the user input can be provided as a combination of the two types of keys. Each key of the plurality of keys has at least one actuable action which can be the input of a character, a command or a function. In this context, "characters" are contemplated to exemplarily include alphabetic letters, language symbols, numbers, punctuation, insignias, icons, pictures, and even a blank space. Input commands and functions can include such things as delete, backspace, moving a cursor up, down, left or right, initiating an arithmetic function or command, initiating a command or function specific to an application program or feature in use, initiating a command or function programmed by the user and other such commands and functions that are well known to those persons skilled in the art. Specific keys or other types of input devices can be used to navigate through the various applications and features thereof. Further, depending on the application 358 or feature in use, specific keys can be enabled or disabled.

In the case of physical keys, all or a portion of the plurality of keys have one or more indicia, representing character(s), command(s), and/or functions(s), displayed at their top surface and/or on the surface of the area adjacent the respective key. In the instance where the indicia of a key's function is provided adjacent the key, the indicia can be printed on the device cover beside the key, or in the instance of keys located adjacent the display screen 322. Additionally, current indicia for the key may be temporarily shown nearby the key on the screen 322.

In the case of software keys, the indicia for the respective keys are shown on the display screen 322, which in one embodiment is enabled by touching the display screen 322, for example, with a stylus to generate the character or activate the indicated command or function. Some examples of display screens 322 capable of detecting a touch include resistive, capacitive, projected capacitive, infrared and surface acoustic wave (SAW) touchscreens.

Physical and software keys can be combined in many different ways as appreciated by those skilled in the art. In one embodiment, physical and software keys are combined such that the plurality of enabled keys for a particular application or feature of the handheld electronic device 300 is shown on the display screen 322 in the same configuration as the physical keys. Using this configuration, the user can select the appropriate physical key corresponding to what is shown on the display screen 322. Thus, the desired character, command or function is obtained by depressing the physical key corresponding to the character, command or function displayed at a corresponding position on the display screen 322, rather than touching the display screen 322.

Figure 11A:
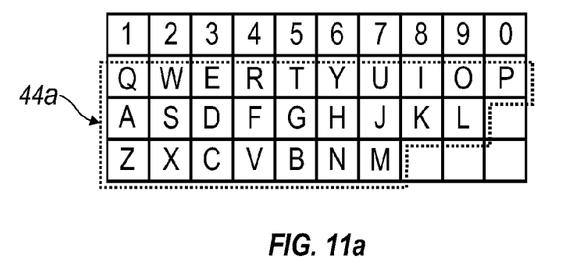
FIG. 11a illustrates an exemplary QWERTY keyboard layout.
Figure 11B:
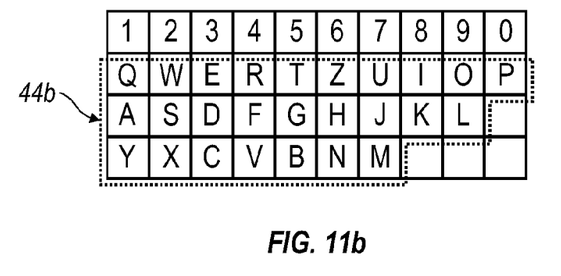
FIG. 11b illustrates an exemplary QWERTZ keyboard layout.
Figure 11C:
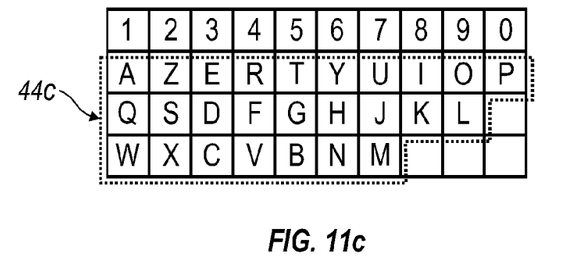
FIG. 11c illustrates an exemplary AZERTY keyboard layout.
Figure 11D:
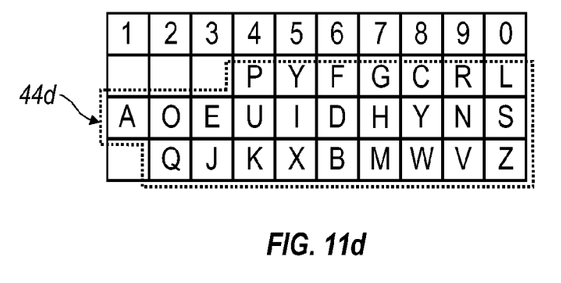
FIG. 11d illustrates an exemplary Dvorak keyboard layout.

The various characters, commands and functions associated with keyboard typing in general are traditionally arranged using various conventions. The most common of these in the United States, for instance, is the QWERTY keyboard layout. Others include the QWERTZ, AZERTY, and Dvorak keyboard configurations. The QWERTY keyboard layout is the standard English-language alphabetic key arrangement 44a shown in FIG. 11A. The QWERTZ keyboard layout is normally used in German-speaking regions; this alphabetic key arrangement 44b is shown in FIG. 11b. The AZERTY keyboard layout 44c is normally used in French-speaking regions and is shown in FIG. 11c. The Dvorak keyboard layout was designed to allow typists to type faster; this alphabetic key arrangement 44d is shown in FIG. 11d.

Figure 12:
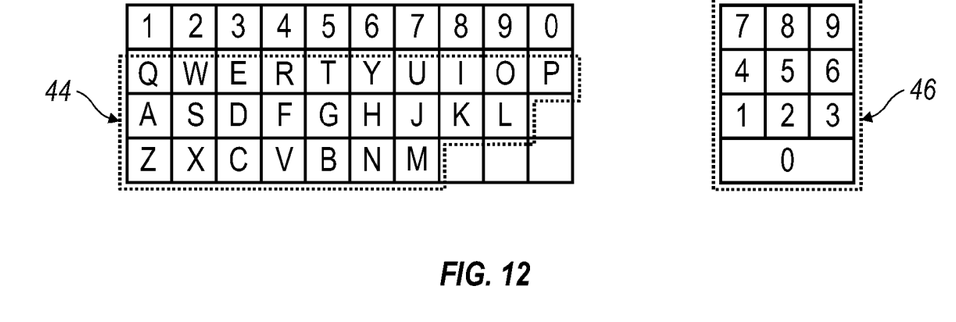
FIG. 12 illustrates a QWERTY keyboard layout paired with a traditional ten-key keyboard.

Alphabetic key arrangements are often presented along with numeric key arrangements. Typically, the numbers 1-9 and 0 are positioned in the row above the alphabetic keys 44a-d, as shown in FIG. 11a-d. Alternatively, the numbers share keys with the alphabetic characters, such as the top row of the QWERTY keyboard. Yet another exemplary numeric key arrangement is shown in FIG. 12, where a "ten-key" style numeric keypad 46 is provided on a separate set of keys that is spaced from the alphabetic/numeric key arrangement 44. The ten-key styled numeric keypad 46 includes the numbers "7", "8", "9" arranged in a top row, "4", "5", "6" arranged in a second row, "1", "2", "3" arranged in a third row, and "0" in a bottom row. Further, a numeric phone key arrangement 42 is exemplarily illustrated in FIG. 13.

Figure 13:
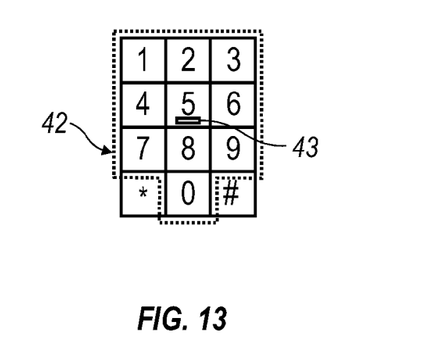
FIG. 13 illustrates ten digits comprising the numerals 0-9 arranged in a traditional, ITU Standard E.161 numeric telephone keypad layout, including the * and # flanking the zero.

As shown in FIG. 13, the numeric phone key arrangement 42 may also utilize a surface treatment on the surface of the center "5" key. This surface treatment is configured such that the top surface of the key is distinctive from the surface of other keys. Preferably the surface treatment is in the form of a raised bump or recessed dimple 43. Alternatively, raised bumps may be positioned on the housing around the "5" key and do not necessarily have to be positioned directly on the key.

It is desirable for handheld electronic devices 300 to include a combined text-entry keyboard and a telephony keyboard. Examples of such mobile communication devices 300 include mobile stations, cellular telephones, wireless personal digital assistants (PDAs), two-way paging devices, and others. Various keyboards are used with such devices and can be termed a full keyboard, a reduced keyboard, or phone key pad.

In embodiments of a handheld electronic device 300 having a full keyboard, the alphabetic characters are singly associated with the plurality of physical keys. Thus, in an English-language keyboard of this configuration, there are at least 26 keys in the plurality so that there is at least one key for each letter.

Figure 14:
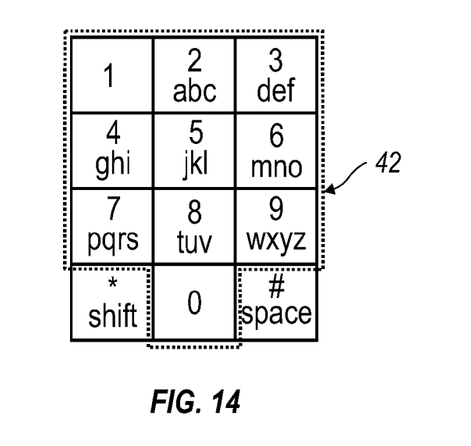
FIG. 14 illustrates a traditional or standard phone key arrangement or layout according to the ITU Standard E.161 including both numerals and letters.

FIGS. 13 and 14 both feature numeric keys arranged according to the ITU Standard E.161 form. In addition, FIG. 14 also incorporates alphabetic characters according to the ITU Standard E.161 layout as well.

As intimated above, in order to further reduce the size of a handheld electronic device 300 without making the physical keys or software keys too small, some handheld electronic devices 300 use a reduced keyboard, where more than one character/command/function is associated with each of at least a portion of the plurality of keys. This results in certain keys being ambiguous since more than one character is represented by or associated with the key, even though only one of those characters is typically intended by the user when activating the key.

Thus, certain software usually runs on the processor 338 of these types of handheld electronic devices 300 to determine or predict what letter or word has been intended by the user. Some examples of software include predictive text routines which typically include a disambiguation engine and/or predictive editor application. The software preferably also has the ability to recognize character letter sequences that are common to the particular language, such as, in the case of English, words ending in "ing." Such systems can also "learn" the typing style of the user making note of frequently used words to increase the predictive aspect of the software. Other types of predictive text computer programs may be utilized with the reduced keyboard arrangements described herein, without limitation. Some specific examples include the multi-tap method of character selection and "text on nine keys".

The keys of reduced keyboards are laid out with various arrangements of characters, commands and functions associated therewith. In regard to alphabetic characters, the different keyboard layouts identified above are selectively used based on a user's preference and familiarity; for example, the QWERTY keyboard layout is most often used by English speakers who have become accustomed to the key arrangement.

FIG. 1 shows a handheld electronic device 300 that carries an example of a reduced keyboard using the QWERTY keyboard layout on a physical keyboard array of twenty keys comprising five columns and four rows. Fourteen keys are used for alphabetic characters and ten keys are used for numbers. Nine of the ten numbers share a key with alphabetic characters. The "space" key and the number "0" share the same key, which is centered on the device and centered below the remainder of the numbers on the keyboard 332. While in other embodiments, the number "0" may be located on other keys. Many of the keys have different sizes than the other keys, and the rows are non-linear. In particular, the keys in the middle column 64 are wider than keys in the outer columns 60, 62, 66 and 68. To readily identify the phone user interface (the second user interface), the numeric phone keys 0-9 include a color scheme that is different from that of the remaining keys associated with the QWERTY key arrangement. As exemplified in FIG. 1, a color scheme of the numeric phone keys has a two tone appearance, with the upper portion 15 of the numeric keys being a first color and the lower portion 16 of the numeric keys being a second color. The first color may be lighter than the second color, or darker than the second color.

Another embodiment of a reduced alphabetic keyboard is found on a standard phone keypad 42. Most handheld electronic devices 300 having a phone key pad 42 also typically include alphabetic key arrangements overlaying or coinciding with the numeric keys as shown in FIG. 14. Such alphanumeric phone keypads are used in many, if not most, traditional handheld telephony mobile communication devices such as cellular handsets.

As described above, the International Telecommunications Union ("ITU") has established phone standards for the arrangement of alphanumeric keys. The standard phone numeric key arrangement shown in FIGS. 13 (no alphabetic letters) and 14 (with alphabetic letters) corresponds to ITU Standard E.161, entitled "Arrangement of Digits, Letters, and Symbols on Telephones and Other Devices That Can Be Used for Gaining Access to a Telephone Network." This standard is also known as ANSI TI.703-1995/1999 and ISO/IEC 9995-8:1994. Regarding the numeric arrangement, it can be aptly described as a top-to-bottom ascending order three-by-three-over-zero pattern.

While several keyboard layouts have been described above, alternative layouts integrating the navigation tool 328 into the keyboard 332 are presented below. The key arrangements and mobile devices 300 described herein are examples of a conveniently sized multidirectional navigational input key that is integrated with an alphanumeric key layout. The example multidirectional navigational input keys can be used in a navigation mode to move, for example, a cursor or a scroll bar. In an alphabetic or numeric mode, it can be used to enter numbers or letters. This dual feature allows for fewer and larger keys to be disposed on the keyboard while providing for a QWERTY, reduced QWERTY, QWERTZ, Dvorak, or AZERTY key layout and navigational input. These familiar keyboard layouts allow users to type more intuitively and quickly than, for example, on the standard alphabetic layout on a telephone pad. By utilizing fewer keys, the keys can be made larger and therefore more convenient to the user.

In some examples, keys in the middle columns (62, 64, 66) are larger than keys in the outer columns (60, 68) to prevent finger overlap on the interior keys. As used herein, middle columns (62, 64, 66) are all columns that are not on the outside left and right sides. The term "middle column" 64 is not limited to the center column. It is easier for a user to press keys on the outer columns (60, 68) without their finger overlapping an adjacent key. This is because part of the user's thumb or finger can overlap the outside housing of the device 300, rather than other keys. Therefore, these outer column keys can be made smaller. The multidirectional navigational input device 328 is provided in the center of the keypad and has a larger surface than the outside keys. The larger surface in the inner part of the keyboard 332 helps prevent finger overlap.

While consumers continue to demand smaller electronic devices, the ability of designers to reduce the size of the device has generally been limited by the components necessary to construct the devices. As described above, one of the limitations of such devices is the keyboard 332. Yet another limitation is the depth required by navigation tools 328 such as the trackball 321. A trackball 321 or other similar component is typically mounted to a printed circuit board (PCB) 450, which accommodates the trackball 321 and other components such as the microprocessor 338 and flash memory 324. Additionally, other components could be mounted on the PCB 450 as described above. Furthermore, the PCB 450 can be provided through one or more individual boards. As described below, the present disclosure provides for mounting mechanisms, including a socket 401 for a trackball assembly 328 to allow for a reduction in the total depth of the device 300.

According to the present disclosure, the PCB 450 is provided with a through hole or a recess for accommodating passage of a portion of the socket 401 therethrough. In order to accommodate the positioning of the socket 401 and associated trackball 321 in the recess, the socket 401 is configured as presented below.

Figure 3:
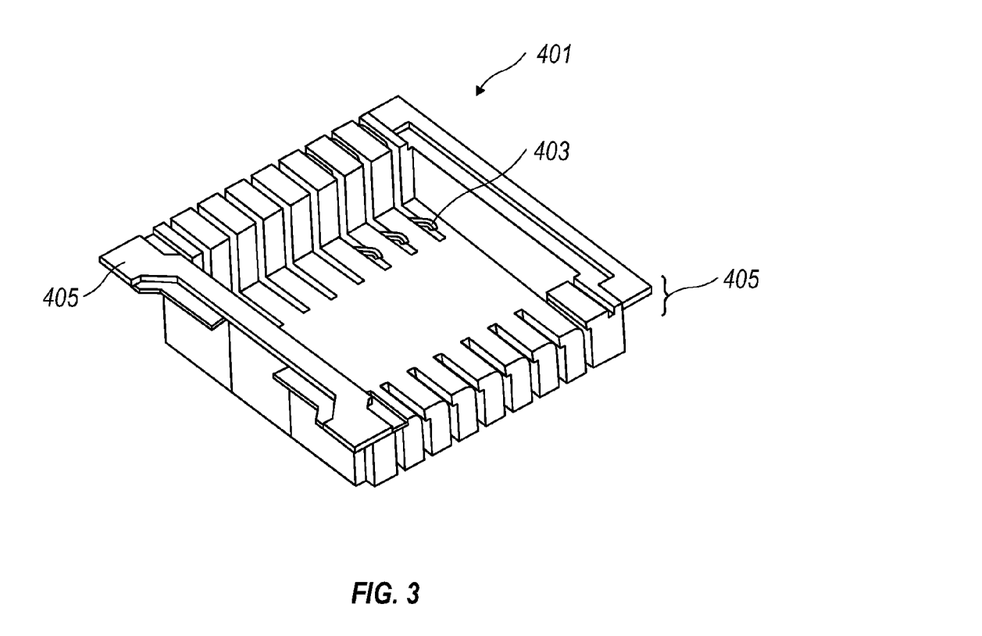
FIG. 3 depicts an embodiment of a socket for mounting a trackball assembly on a printed circuit board according to the present disclosure.
Figure 4:
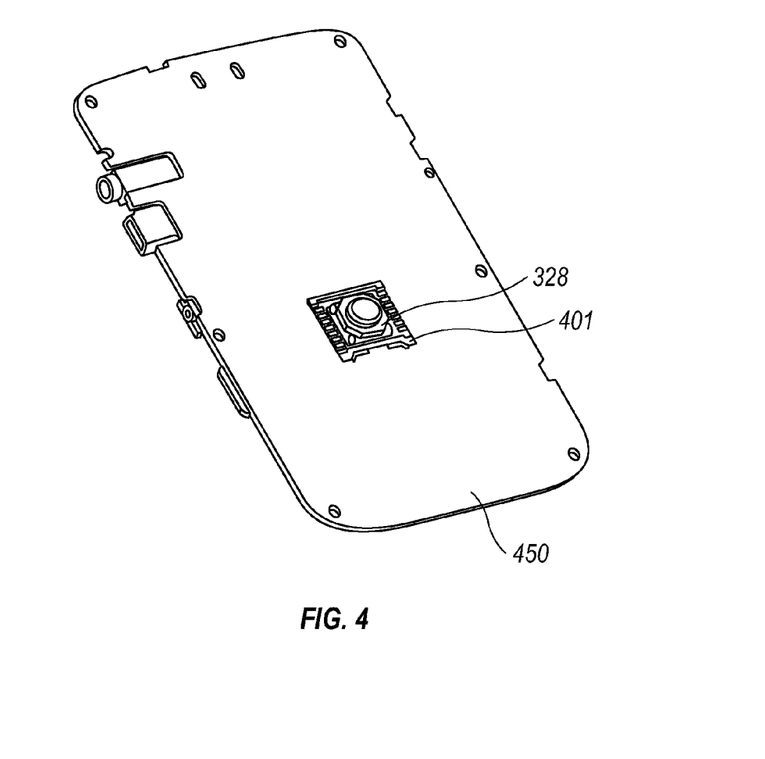
FIG. 4 illustrates a printed circuit board having a trackball assembly mounted within a socket which is correspondingly mounted through a printed circuit board.
Figure 5:
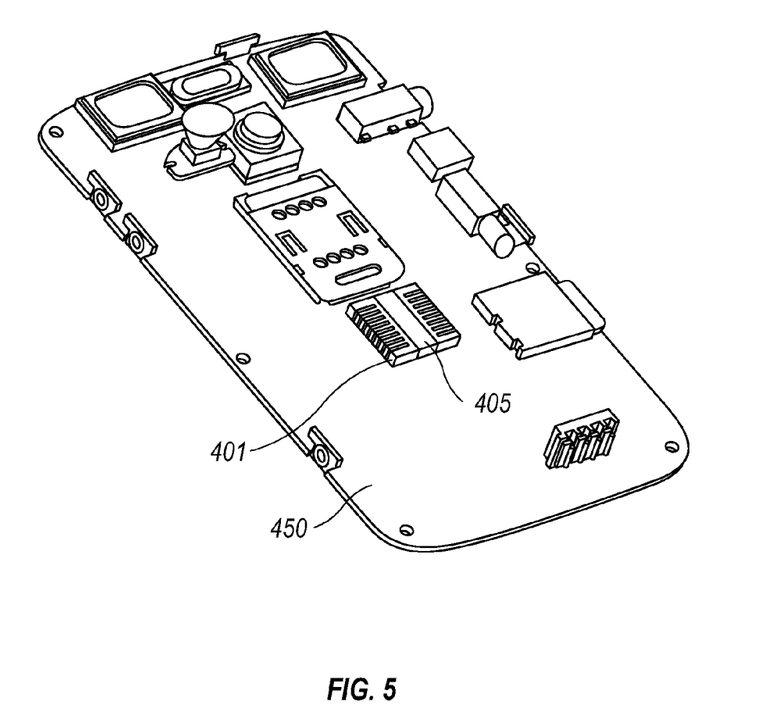
FIG. 5 illustrates a bottom side of the trackball assembly within the socket of FIG. 4.

In a first embodiment, as illustrated in FIG. 3, a socket 401 for mounting a trackball assembly 328 on a printed circuit board 450 is disclosed. The socket 401 includes biased electrical interconnectors 403 for connecting the trackball assembly 328 to the PCB 450. The electrical interconnectors 403 allow for the trackball assembly 328 to be in signal communication with the microprocessor 338 of the handheld electronic device 300. This socket 401 can be mounted in an installation recess in the PCB 450. The installation recess accommodates the passage of at least a portion of the socket 401 therethrough. Additionally, the trackball assembly 328 can be mounted once the socket 401 is in the installed position. In order to provide additional support the socket 401 can be provided with stiffeners 405. In at least one embodiment, the stiffeners 405 are metal. In another embodiment, the stiffeners 405 are a stiff plastic. The back side of the PCB 450 with a protruding socket 401 is illustrated in FIG. 5. While the socket 401 is illustrated as protruding beyond the PCB 450 surface, in other embodiments, the recess may not extend all the way through the PCB 450.

Figure 6:
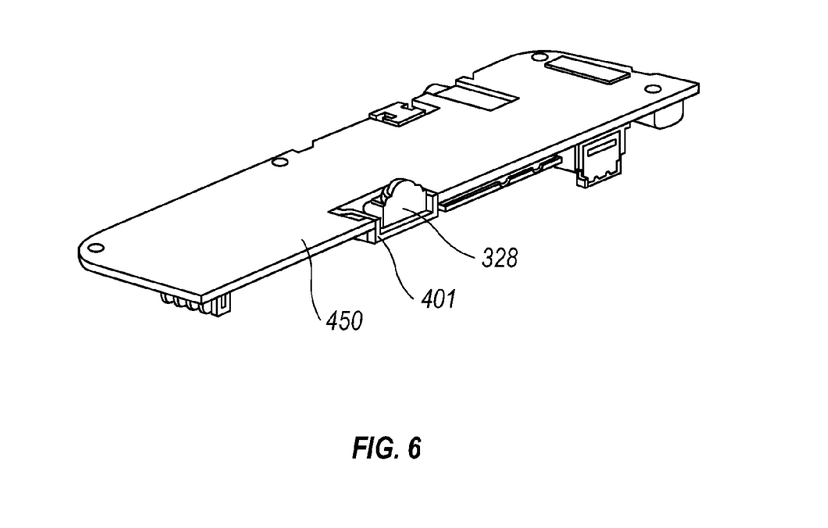
FIG. 6 illustrates a cross-sectional view of the trackball assembly within the socket of FIG. 4.

As shown in FIG. 6, a cross-sectional view illustrates a trackball assembly 328 mounted within a socket 401. The socket 401 has been mounted within an installation recess in the PCB 450. The cross-sectional view illustrates that by mounting socket 401 within an installation recess in the PCB 450, a thinner handheld electronic device 300 may be constructed. The socket 401 may be connected to the PCB 450 by soldering the socket 401 to the PCB 450. Additionally, the socket facilitates the signal communication between the trackball assembly 328 and microprocessor 338. Additionally, the PCB 450 can be configured to allow additional signal communication between other components mounted thereon.

Figure 7:
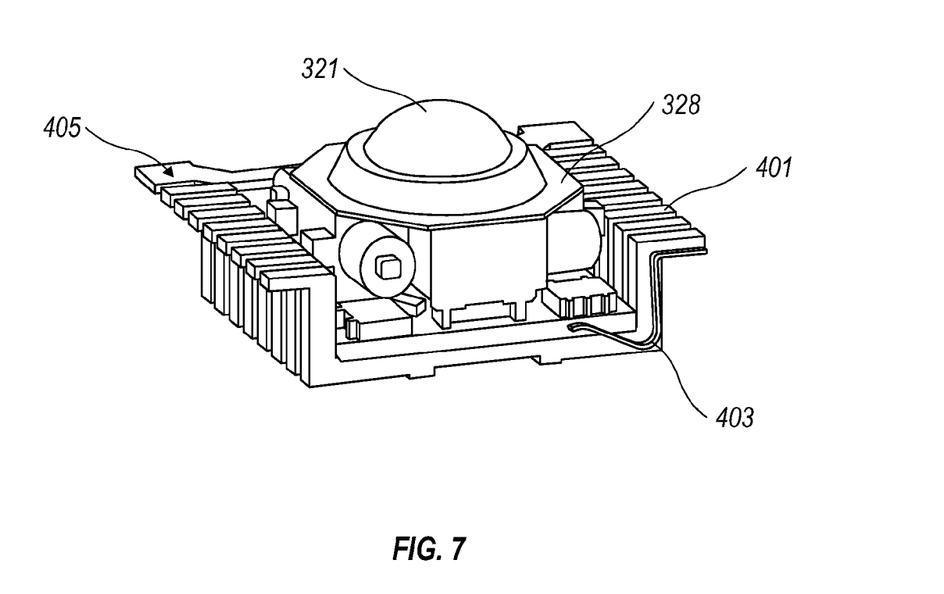
FIG. 7 depicts a trackball assembly mounted within the socket of FIG. 3.

FIG. 7 depicts a trackball assembly 328 mounted within a socket 401 according to one embodiment of the present disclosure. As shown, biased electrical interconnector 403 connects socket 401 with an under side of trackball assembly 328. The biased electrical interconnector 403 also may establish biased electrical contact with a corresponding electrical contact on a printed circuit board 450 when the socket 401 is installed in an installation recess thereof.

The biased electrical interconnectors 403 as shown in various figures can be made of any electrically conductive material. In a preferred embodiment the biased electrical interconnectors 403 are made predominantly of copper.

Figure 8:
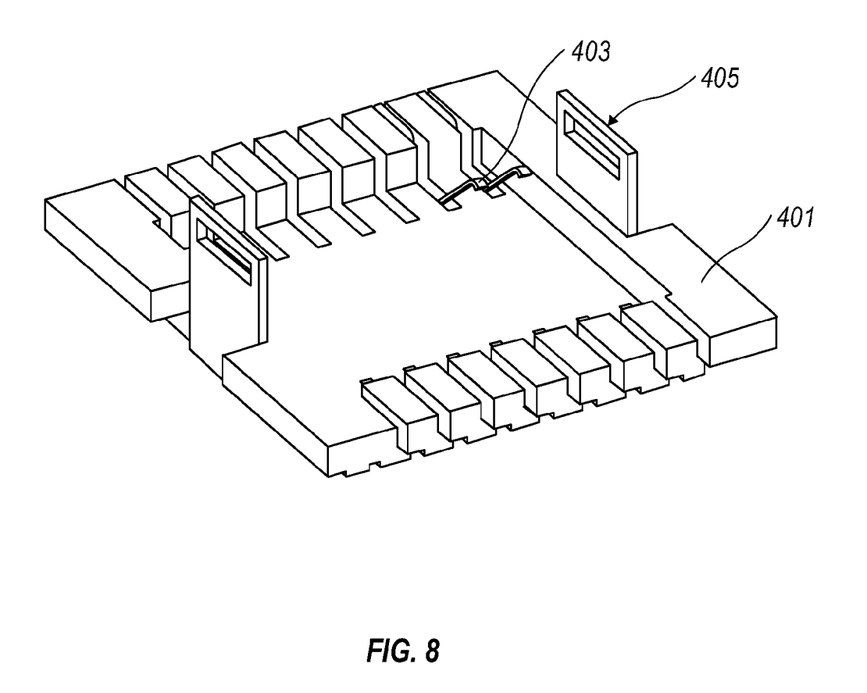
FIG. 8 depicts another embodiment of a socket for mounting a trackball assembly on a printed circuit board according to present disclosure.

FIG. 8 depicts another embodiment of a socket 401 for mounting a trackball assembly 328 on a printed circuit board. The socket 401 includes biased electrical interconnectors 403 for connecting to a trackball assembly 328. The stiffener 405 can be constructed of metal with cutouts to accommodate mounting of additional components on the socket 401. Alternatively, the cutouts can accommodate a portion of the house or keypad and thus provide for further securement of the socket 401 within the device 300.

Figure 9:
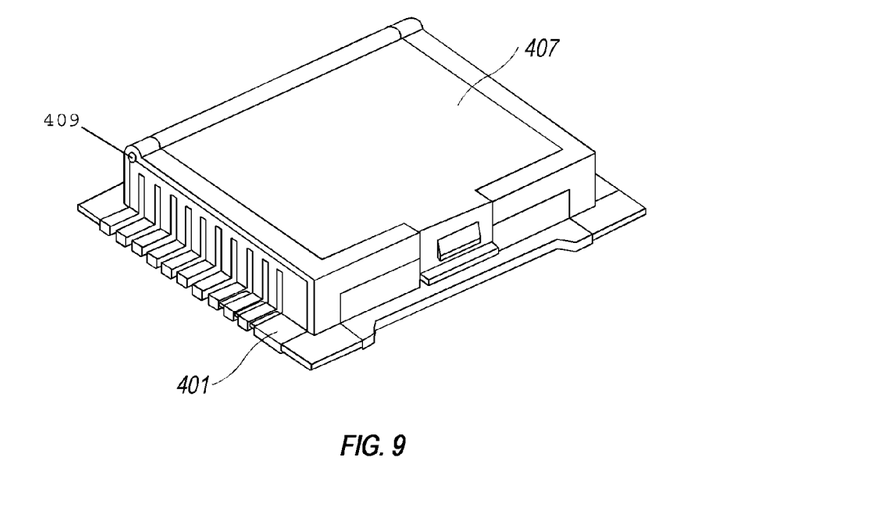
FIG. 9 depicts a bottom view of still another embodiment of a socket for mounting a trackball assembly on a printed circuit board, wherein the socket includes a hinged door.

In yet another embodiment as illustrated in FIG. 9, a socket 401 is shown which has a bottom portion that includes a hinged door 407 and a hinge 409. In a preferred embodiment the hinged door 407 is made of metal. When the socket 401 is installed in the recess of the PCB 450, the hinged door 407 allows the removal and/or replacement of the trackball assembly 328 from the handheld electronic device 300. This enables the user or a service center to replace the trackball assembly 328 should the trackball assembly 328 fail or experience other problems which reduces its usability. This can be further aided in the construction of the device which has a rear panel that can be removable. This allows access to the portion of the PCB 450 which has the socket 401 exposed on the rear side of the PCB 450.

Figure 10:
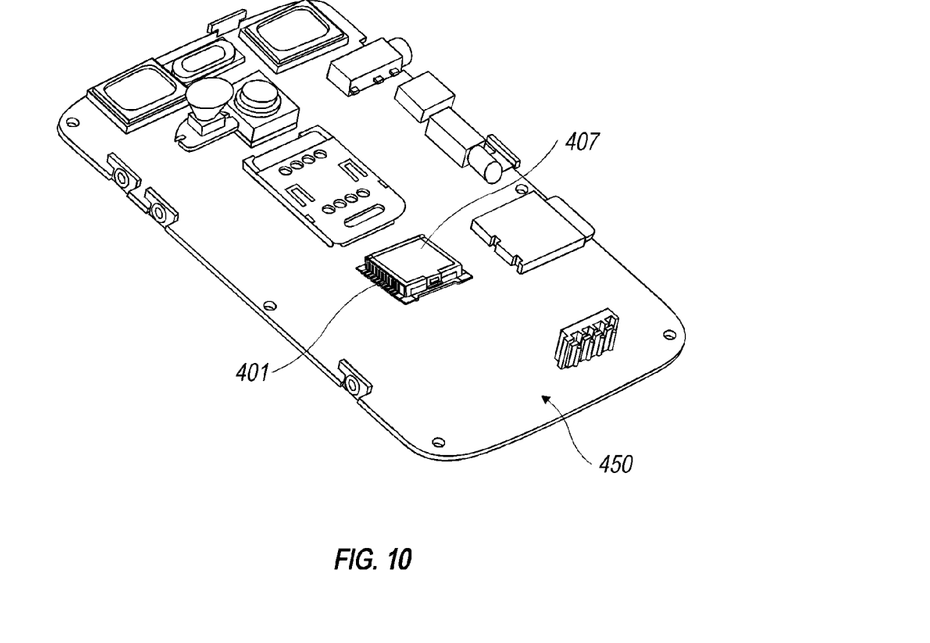
FIG. 10 depicts a backside of a printed circuit board having the socket, which is correspondingly mounted through a printed circuit board, of FIG. 9.

FIG. 10 illustrates the bottom portion of a socket 401 having a top and bottom portion for mounting a trackball assembly 328 positioned within a printed circuit board 450 according to one embodiment of the present disclosure. The bottom portion includes a hinged door 407. The hinged door allows for retention of the door yet provides access to the trackball assembly 328.

Exemplary embodiments have been described hereinabove regarding both handheld electronic devices 300, as well as the communication networks 319 within which they cooperate. Again, it should be appreciated that the focus of the present disclosure is a socket for mounting a trackball assembly on the handheld communication device. Various modifications to and departures from the disclosed embodiments will occur to those having skill in the art. The subject matter that is intended to be within the spirit of this disclosure is set forth in the following claims.

What is claimed is:

1. An apparatus for connecting a navigation tool to a printed circuit board, the apparatus comprising:
   a socket configured to receive the navigation tool in a receiving space formed therein, said socket having an exterior configured to fit within an installation recess in the printed circuit board;
   a bottom portion of the socket defining an aperture;
   a hinged door coupled to the socket, the hinged door being configured to cover and uncover the aperture to allow removal or replacement of the navigation tool through the aperture; and
   a biased electrical interconnector extending from an interior surface of the receiving space into said receiving space, said electrical interconnector oriented within said receiving space at a position that establishes biased electrical contact with a target electrical contact of said navigation tool and biased electrical contact with a corresponding electrical contact on said printed circuit board when the socket is installed in said installation recess.

2. The apparatus as recited in claim 1, wherein said electrical interconnector is electrically connected with said electrical connector by an electrical jumper located on said socket.

3. The apparatus as recited in claim 1, wherein said biased electrical interconnector is mounted to said socket at a bottom side wall of the recess.

4. The apparatus as recited in claim 1, wherein said biased electrical interconnector is made of copper.

5. The apparatus as recited in claim 1, wherein said hinged door is made of metal.

6. The apparatus as recited in claim 1, wherein said socket includes a stiffener.

7. The apparatus as recited in claim 6, wherein the stiffener is made of metal.

8. The apparatus as recited in claim 7, wherein the stiffener is designed to be soldered to the printed circuit board.

9. The apparatus as recited in claim 8, wherein the stiffener includes a cut out for mounting the socket onto a housing.

10. The apparatus as recited in claim 8, wherein the stiffener includes a cut out for mounting the socket onto a keyboard.

11. A wireless handheld device comprising:
   a printed circuit board having a top face and a bottom face, said printed circuit board defining a recess;

a socket configured to receive a navigation tool in a receiving space formed therein, said socket having an exterior configured to fit within said recess;

a bottom portion of the socket defining an aperture;

a hinged door coupled to the socket, the hinged door being configured to cover and uncover the aperture to allow removal or replacement of the navigation tool through the aperture; and a biased electrical interconnector extending from an interior surface of the receiving space into said receiving space, said electrical interconnector oriented within said receiving space at a position that establishes biased electrical contact with a target electrical contact of said navigation tool and electrical contact with a corresponding electrical contact on said printed circuit board when the socket is installed in said recess.

12. The wireless handheld device as recited in claim 11, wherein said electrical interconnector is electrically connected with said electrical connector by an electrical jumper located on said socket.

13. The wireless handheld device as recited in claim 11, wherein said biased electrical interconnector is made of copper.

14. The wireless handheld device as recited in claim 11, wherein said hinged door is made of metal.

15. The wireless handheld device as recited in claim 11, wherein said socket includes a stiffener.

16. The wireless handheld device as recited in claim 15, wherein the stiffener is made of metal.

17. The wireless handheld device as recited in claim 15, wherein the stiffener is designed to be soldered to the printed circuit board.

18. The wireless handheld device as recited in claim 17, wherein the stiffener includes a cut out for mounting the socket onto a housing.

19. The wireless handheld device as recited in claim 17, wherein the stiffener includes a cut out for mounting the socket onto a keyboard.

20. The apparatus of claim 1, wherein the navigation tool is a trackball device.

21. The wireless handheld device of claim 11, wherein the navigation tool is a trackball device.

* * * * *